United States Patent [19]

Won

[11] 4,115,689

[45] Sep. 19, 1978

[54] LEVELING DEVICE FOR FORMING X-RAY SPECIMEN

[76] Inventor: Vann Y. Won, 6697 Gloria Dr., Sacramento, Calif. 95831

[21] Appl. No.: 813,392

[22] Filed: Jul. 6, 1977

[51] Int. Cl.² .............................................. H01J 37/20

[52] U.S. Cl. ............................. 250/272; 250/277 CH

[58] Field of Search ........ 250/272, 273, 274, 277 CH; 356/246

[56] References Cited

U.S. PATENT DOCUMENTS

| | | | |
|---|---|---|---|
| 3,378,684 | 4/1968 | Mentink | 250/277 CH |
| 4,037,109 | 7/1977 | Hosokawa | 250/272 |

*Primary Examiner*—Craig E. Church

*Attorney, Agent, or Firm*—Joseph E. Rusz; James S. Shannon

[57] ABSTRACT

A leveling apparatus used in conjunction with a specimen holder and plastic film window material to accurately and consistently form a flat, bubble free analysis window on the open face of the specimen holder. The specimen holder in the form of a shallow cylindrical cup is slightly overfilled and covered by the plastic film. Placement of the mating leveling apparatus over the film squeezes out trapped air bubbles, levels the exposed face of the specimen, draws the plastic film tight over the exposed face of the specimen, and allows easy installation of a film retaining O-ring to maintain the specimen material in a level state within the holder.

2 Claims, 4 Drawing Figures

LEVELING DEVICE FOR FORMING X-RAY SPECIMEN

RIGHTS OF THE GOVERNMENT

The invention described herein may be manufactured and used by or for the Government of the United States for all governmental purposes without the payment of any royalty.

FIELD OF THE INVENTION

This invention relates to specimen holders. More particularly, the invention addresses itself to a specimen holder and the associated apparatus for preparing an acceptable surface in the X-ray fluorescence analysis of liquid or powder samples.

BACKGROUND OF THE INVENTION

X-ray fluorescence analysis is a well known and frequently used technique to rapidly analyze specimens for both the existence of certain elements and their relative magnitudes in sample compositions. In general, the specimen is illuminated by a source of X-rays, causing secondary X-ray emissions from the specimen which have distinct and measurable wavelength signatures attributable to the elements present. A dispersion crystal is then used to separate the secondary emission energy magnitudes at various wavelengths by transformation into energy magnitudes at distinct and separate angles; see FIG. 1. An X-ray counter/recorder is swept over the arc to obtain a signature for determination of the elements present and their relative magnitudes. For more details the reader is referred to the book X-RAY SPECTROCHEMICAL ANALYSIS by L. S. Birks, first published in 1959 by Interscience Publishers, Incorporated.

To best utilize such complex and expensive equipment in the repetitious analysis of numerous but similar test specimens, it is necessary to have a specimen holder and preparation apparatus which is fairly inexpensive, yet, can insure test results that are accurate and reproducible. Recognition of the deficiencies in available hardware is foremost in the development of the apparatus disclosed herein. It was the awareness that the control of surface flatness and specimen volume in a shallow sample holder are related to the accuracy and repeatability of X-ray fluorescence analyses, that precipitated the evolution of the disclosed apparatus.

General specimen holders are commercially available, e.g., the SPEX LIQUID SAMPLE CELL, General Electric Company part number A7011BE or Spex Industries part number 3515. The use of these types of holders was satisfactory in the past, but with refinements in test equipment and procedures to improve measurement accuracy such holders alone are inadequate to control specimen surface and volume parameters. In view of these deficiencies, many users of X-ray fluorescence equipment are attempting to develop specimen holders which are compatible with contemporary sampling rates and equipment accuracies.

An effective sample holder must include a mating apparatus which appropriately prepares the specimen face for X-ray analysis. This requires a device which will take a filled specimen holder having a sheet of plastic film draped over the sample face, squeeze out any trapped air bubbles, accurately level the exposed specimen face, stretch the film taut over the specimen, and allow the installation of a film holding ring while confining the specimen.

BRIEF SUMMARY OF THE INVENTION

According to this invention, a loader, in the form of a hollow truncated cone closed by a flat transparent plate near the wide end, when used in combination with a shallow cylindrical cuplike specimen holder, a sheet of plastic film and a ring retainer to hold the film, is used to prepare specimens of oil, hydraulic fluids, and powders for X-ray fluorescence analysis to determine the content of elements such as sulfur and chlorine. The apparatus disclosed herein produces a combination by which a specimen holder, filled to overflowing, can accurately and repeatedly be leveled and sealed without entrapping bubbles, to produce an exposed face having a consistent specimen depth and a known volume.

IN THE DRAWINGS

DETAILED DESCRIPTION

Figure 1:
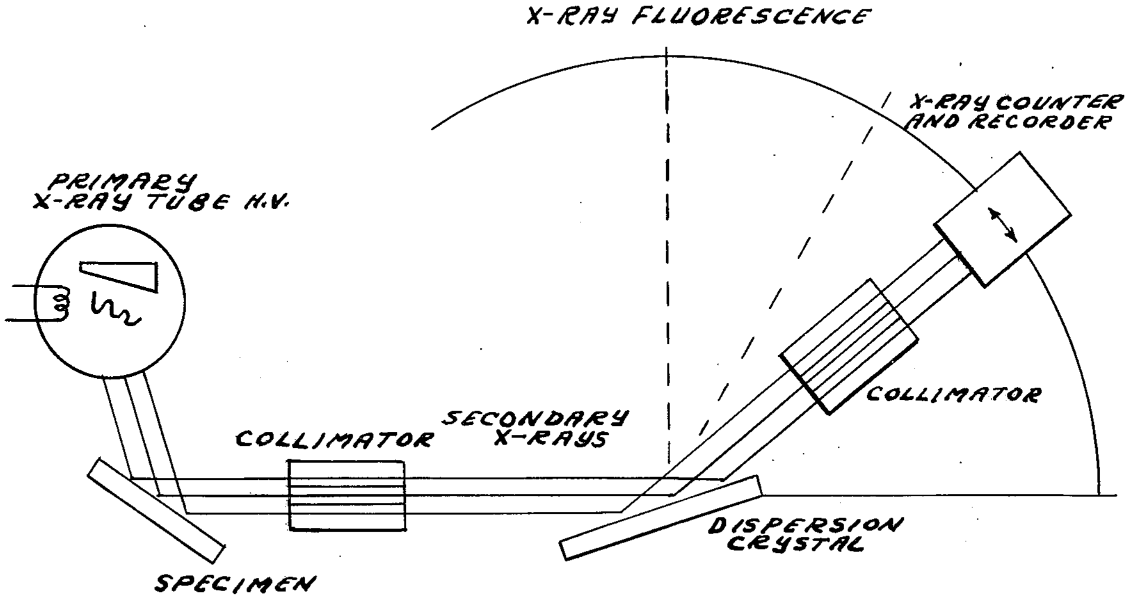
FIG. 1 is a pictorial representation of the equipment and techniques used in X-ray fluorescence analysis.
Figure 2:
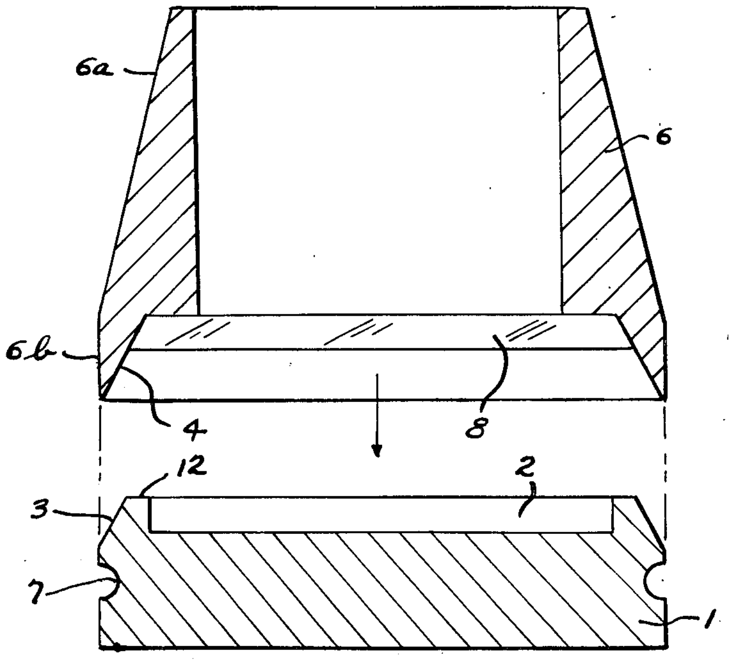
FIG. 2 is a cross sectional view illustrating an embodiment of the invention.

Referring to FIG. 2 of the drawings, there is illustrated an embodiment of the invention. Shown is a cross section of cylindrical specimen holder 1 with shallow cylindrical volume 2 for placement of the specimen. Surface 3 is a chamfer fabricated to meet the mating surface 4 of loader 6. Groove 7 of holder 1 is designed to accept an O-ring type elastic band.

Also shown in FIG. 2 is a cross sectional view of loader 6, comprising a hollow truncated cone portion **6*a* and cylindrical portion 6*b* of the same outside diameter as holder 1, and having at its lower end a flat transparent plate 8 and a tapered surface 4, the latter designed to mate with surface 3**.

Figure 3:
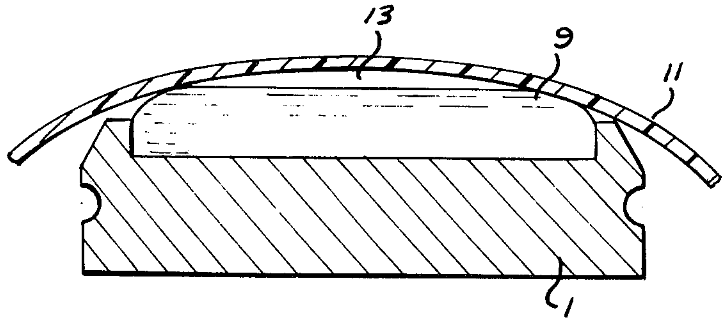
FIG. 3 shows a cross sectional view of the specimen holder, with a liquid specimen and a draped plastic film but before press leveling with the loader apparatus.

The combination is used as follows. As shown in FIG. 3, liquid or powder specimen material 9 is placed in specimen holder 1 until overflowing and then covered by plastic film 11 (shown disproportionately thick for purposes of illustration). Loader 6 in FIG. 2 is thereafter brought down onto specimen holder 1 until plate 8 of the loader rests upon surface 12 of the specimen holder. The effect of this action is to squeeze out entrapped air bubbles 13 and any excess of specimen material 9, level the upper surface of the specimen material, and stretch the plastic film tight over the exposed surface of the specimen.

Figure 4:
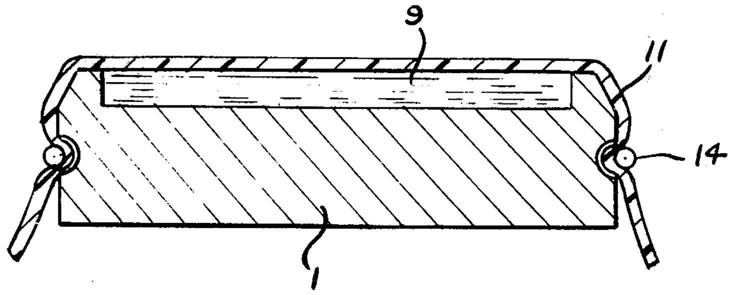
FIG. 4 is a cross section of a completely prepared specimen after installation of the retaining ring.

The specimen is retained in the required state by immediately sliding O-ring type retainer 14 over the conical outside surface of loader 6, onto plastic film 11 and into groove 7 of the specimen holder. Upon removal of loader 6, the specimen is prepared for X-ray fluorenscence analysis, as shown in FIG. 4.

Flat plate 8 in FIG. 2 not only serves to level the specimen material but by its transparency allows visual control of the leveling and bubble expulsion process.

As may be evident, the use of the embodiment described above not only produces a smooth, bubble-free specimen surface for X-ray analysis but does so quickly and with an inexpensive piece of apparatus. An auxiliary benefit arising from the use of such apparatus, which is not available with standard specimen holders, is the accurate definition and control of specimen volume, heretofore not even recognized as being related to accurate X-ray fluorescence analysis.

As will be apparent to those skilled in the art, modifications of the present invention can be made in view of the foregoing disclosure. Such modifications fall within the spirit and scope of the invention.

I claim:

1. A specimen holder and loader therefor for use in the preparation of specimens for X-ray fluorescence analysis, comprising:

a. a cylindrical holder having a chamfered end with a shallow cylindrical specimen cavity of such diameter as to leave a flat rim between the cavity edge and the chamfer, and having a circumferential groove between the chamfer and the other end; and b. a loader in the form of a circular body having a maximum outside diameter at one end equal to the outside diameter of the holder and a somewhat smaller minimum outside diameter at the other end, and having a circular recess in its larger end defined by a tapered wall congruent with said chamfer and a bottom in the form of a flat plate;

c. said loader operating when pressed over said holder, after said cavity has been slightly overfilled with the specimen material and covered with a thin plastic film, to level the specimen by expelling excess material over said rim and also to facilitate the installation of an elastic O-ring in said groove for retaining the film.

2. Apparatus as claimed in claim 1 in which said plate is transparent and said loader is hollow between said plate and its smaller end.

* * * * *